United States Patent [19]

Lien

[11] Patent Number: 5,572,460
[45] Date of Patent: Nov. 5, 1996

[54] STATIC RANDOM-ACCESS MEMORY CELL WITH CAPACITIVE COUPLING TO REDUCE SENSITIVITY TO RADIATION

[75] Inventor: Chuen-Der Lien, Mountain View, Calif.

[73] Assignee: Integrated Device Technology, Inc., Santa Clara

[21] Appl. No.: 143,321

[22] Filed: Oct. 26, 1993

[51] Int. Cl.⁶ ................................................ G11C 11/00
[52] U.S. Cl. ........................................ 365/154; 365/190
[58] Field of Search .................................. 365/154, 156, 365/190; 307/279

[56] References Cited

U.S. PATENT DOCUMENTS

| | | | |
|---|---|---|---|
| 3,969,708 | 7/1976 | Sonoda | 365/154 |
| 4,442,509 | 4/1984 | Herndon | 365/154 |
| 4,532,609 | 7/1985 | Iizuka | 365/154 |
| 4,780,751 | 10/1988 | Nishimoto | 365/154 X |

OTHER PUBLICATIONS

Kerns et al, "The Design of Radiation–Hardened ICs for Space: A Compendium of Approaches," *Procs. IEEE*, Nov. 1988, pp. 1470–1509.

Ochoa et al, "A Proposed New Structure for SEU Immunity in SRAM Employing Drain Resistance," *IEEE Elec. Dev. Lett.*, Nov. 1987, pp. 537–539.

*Primary Examiner*—Joseph A. Popek
*Attorney, Agent, or Firm*—Skjerven, Morrill, MacPherson, Franklin & Friel; Philip J. McKay; Ronald J. Meetin

[57] ABSTRACT

Radiation hardening for a static memory cell that centers around a pair of storage transistors (QS1 and QS2) coupled to a load (30) for storing a bit of information is achieved with a coupling capacitor (CC) situated between the storage transistors. In an MOS implementation, the coupling capacitor is typically implemented with a pair of capacitors (CC1 and CC2), each coupled between the drain and gate electrode of an associated one of the storage transistors.

35 Claims, 7 Drawing Sheets

FIG. 10f

STATIC RANDOM-ACCESS MEMORY CELL WITH CAPACITIVE COUPLING TO REDUCE SENSITIVITY TO RADIATION

FIELD OF THE INVENTION

This invention relates to static random-access memory ("RAM") semiconductor cells having decreased sensitivity to alpha particles and similar types of radiation. This invention also relates to methods for manufacturing such static RAM cells.

BACKGROUND ART

Radiation of various types can detrimentally affect the operation of a semiconductor integrated circuit ("IC"). For example, alpha-particle radiation is particularly troublesome for static RAM cells, especially in space applications. Alpha particles can cause the state of a static RAM cell to change in a random, normally undesirable manner.

As static RAM fabrication technology has become more sophisticated and cell dimensions have shrunk, the amount of alpha-particle radiation needed to cause an undesired state change has decreased. Consequently, the radiation sensitivity problem has become more serious.

One category of techniques investigated for reducing the sensitivity of a static RAM cell to radiation entails installing resistors at certain critical points in the cell Generally see Kerns et al, "The Design of Radiation-Hardened ICs for Space: A Compendium of Approaches," *Procs IEEE*, Nov. 1988, pp. 1470–1509. In particular, see the sections of Kerns et al authored by Rockett, Pridmore, and Berndt.

Figure 1:
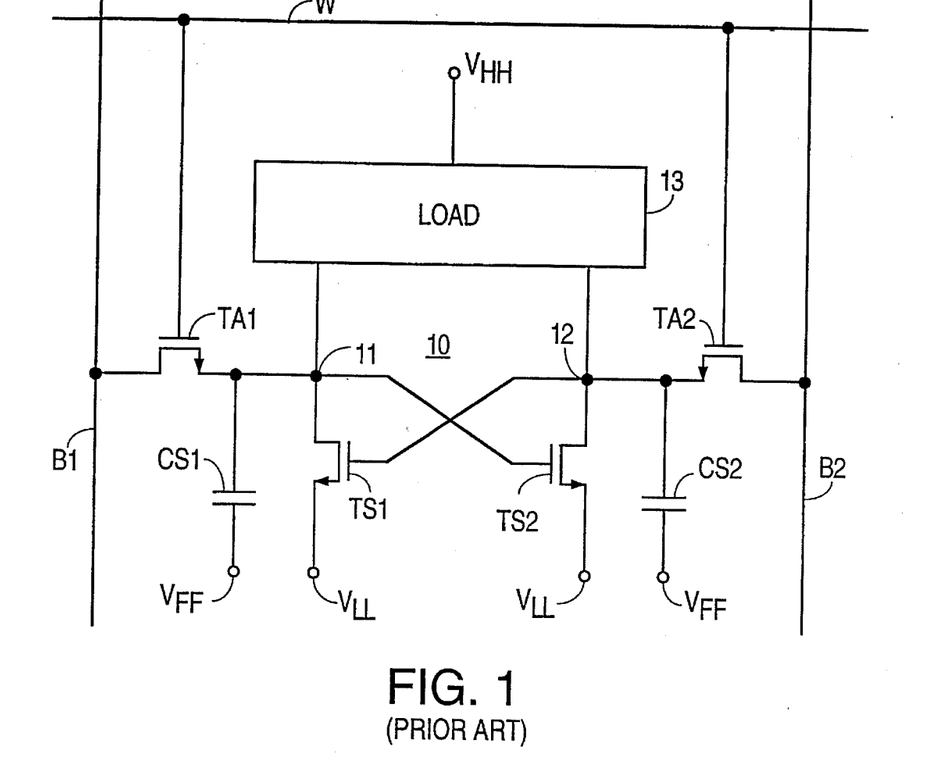
FIG. 1 is a circuit diagram of a prior art radiation-hardened MOS static RAM cell, including cell-access circuitry.

Capacitive radiation-hardening techniques have also been investigated for MOS static RAM cells. Referring to the drawings, FIG. 1 illustrates a capacitively hardened MOS static RAM cell 10 of conventional design. Static RAM cell 10 centers around cross-connected enhancement-mode N-channel insulated-gate storage field-effect transistors ("FETs") TS1 and TS2 whose sources are connected to a source of a low supply voltage $V_{LL}$. Information is stored in static RAM cell 10 at storage nodes 11 and 12 at the drains of FETs TS1 and TS2.

Storage nodes 11 and 12 are coupled through enhancement-mode N-channel insulated-gate access FETs TA1 and TA2 to bit lines B1 and B2. The TA1 and TA2 gate electrodes are connected to a word line W. A load 13 is connected between a source of a high supply voltage $V_{HH}$ and the TS1 and TS2 drains. Load 13 typically consists of a pair of resistors or a pair of enhancement-mode P-channel insulated-gate FETs.

A pair of capacitors CS1 and CS2 connected between storage nodes 11 and 12, on one hand, and a source of a reference voltage $V_{FF}$, on the other hand, provide radiation hardening in cell 10. Capacitors CS1 and CS2 increase the charge stored at nodes 11 and 12. This reduces sensitivity to alpha particles.

Each of capacitors CS1 and CS2 can be formed with a pair of conductive plates sandwiched about a dielectric film. A significant disadvantage of creating capacitors CS1 and CS2 as parallel-plate elements is that the parallel-plate elements occupy a relatively large amount of additional device surface area — i.e., cell area beyond that occupied by the other elements of the RAM cell.

Figure 2:
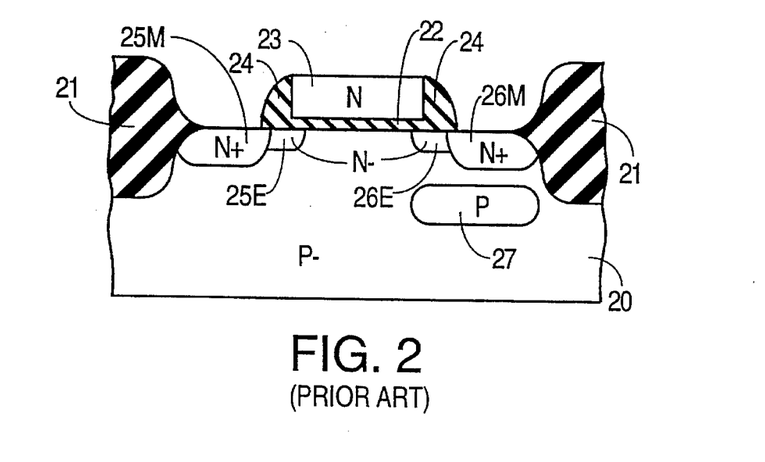
FIG. 2 is a cross-sectional view of a prior art structure for one storage transistor and associated radiation-hardening capacitor in FIG. 1.

Alternatively, capacitors CS1 and CS2 can be "junction" capacitors respectively merged with FETs TS1 and TS2. FIG. 2 depicts the junction case in which item 20 is a lightly doped P-type monocrystalline silicon ("monosilicon") semiconductor substrate. Item 21 is an annular oxide-isolation region that defines an active semiconductor island for FET TS1 or TS2. Items 22, 23, and 24 are a gate dielectric layer, a gate electrode, and a pair of oxide spacers. The source for FET TS1 or TS2 consists of a heavily doped main N-type source zone 25M and a lightly doped N-type source extension 25E. The drain consists of a heavily doped main N-type drain zone 26M and a lightly-doped N-type drain extension 26E.

Junction capacitor CS1 or CS2 in FIG. 2 is implemented with moderately doped P-type region 27 situated below the drain. P region 27, which is formed by ion implantation, increases the capacitance at the drain/substrate junction. $V_{FF}$ is $V_{LL}$. An MOS static RAM cell using junction capacitors at the drain nodes to reduce alpha-particle sensitivity can also be formed with the polarities reversed from that shown in FIGS. 1 and 2.

When capacitors CS1 and CS2 are formed as junction elements, the capacitance depends on the chip surface area taken up by P regions 27. That is, increasing the surface area utilized by regions 27 increases the capacitance. The amount of capacitance and, consequently, the level of radiation hardness are relatively small unless the junction-capacitance chip surface area is relatively large. As in the parallel-plate case, this is quite disadvantageous, especially in high-performance space applications where high levels of radiation hardness are needed.

GENERAL DISCLOSURE OF THE INVENTION

In accordance with the present invention, a static RAM cell utilizes capacitive coupling to decrease sensitivity to radiation such as alpha particles. The capacitive coupling is implemented in such a way that the ratio of radiation-hardness level to total cell surface area reaches a considerably higher, and therefore better, value than achieved with the prior art capacitively hardened techniques described above. Consequently, the invention provides a substantial advance over the prior art.

The present static RAM cell contains a pair of like-polarity storage transistors having respective first flow electrodes, respective second flow electrodes, and respective control electrodes cross coupled with the second electrodes for storing a bit of information. A load is coupled to the second electrodes. A non-parasitic capacitor is coupled between the second electrodes. The coupling capacitor provides radiation hardness by increasing the amount of charge stored at cell storage nodes at the second electrodes.

Each storage transistor is normally an FET having a source, a drain, and a gate electrode which respectively are the first, second, and control electrodes for that transistor. The coupling capacitor is thus situated between the drains. If the coupling capacitor is fabricated as a pair of dielectrically separated parallel plates whose capacitance is the same as that of each of the parallel-plate capacitors used in the prior art SRAM cell described above, the amount of charge increase at the storage nodes in the invention is approximately the same as in the prior art cell. Inasmuch as the invention utilizes one less such capacitor than in the prior art, the device surface area for the present static RAM cell is considerably less.

The coupling capacitor is preferably implemented with a pair of capacitors arranged in parallel so that the sum of their effective capacitances is the capacitance of the coupling capacitor. One of the capacitors is coupled between the drain and gate electrode of one of the storage FETs, while the other capacitor is coupled between the drain and gate electrode of the other storage FET.

The foregoing embodiment of the radiation-hardened static RAM cell is fabricated by a process in which the storage FETs are formed along a major surface of a semiconductor body that contains a primary region of one conductivity type. Each storage FET is formed in conjunction with an associated capacitor by a procedure that entails creating a patterned electrically conductive gate electrode above the primary region and introducing semiconductor dopant of opposite conductivity type into the primary region to form source and drain regions laterally separated by a channel region below the gate electrode. The source laterally extends under the gate electrode. The drain laterally extends under the gate electrode to a distance greater than the source such that a non-parasitic capacitance exists between the drain and gate electrode. To create the source and drain in this asymmetric manner, the source/drain dopant introduction operation is typically performed in two steps during one of which the intended region for the source is masked.

Electrical interconnections are provided to couple the drain of each storage FET to the gate electrode of the other storage FET. Finally, the load is provided to complete the basic cell structure. This process is quite simple and yields a radiation-hardened static RAM cell with well-controlled characteristics.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

The present invention utilizes general storage transistors identified by reference symbols that begin with the letters "QS". Each such QS transistor has a first flow electrode (1E), a second flow electrode (2E), and a control electrode for controlling current flow between the flow electrodes (1E and 2E). Charge carriers, either electrons or holes, that move between the flow electrodes of each QS transistor originate at its first flow electrode and terminate at its second flow electrode. Current flow begins when the voltage between the control electrode and the first flow electrode passes a specified threshold level. The current (if any) flowing in the control electrode during conductive transistor operation is much smaller than that moving between the flow electrodes.

Each QS transistor is typically an FET of the insulated-gate or junction type. Its source, drain, and gate electrode respectively are the first, second, and control electrodes. Alternatively, each QS transistor can be a bipolar transistor having an emitter, a collector, and a base which respectively are the first, second, and control electrodes.

Figure 3:
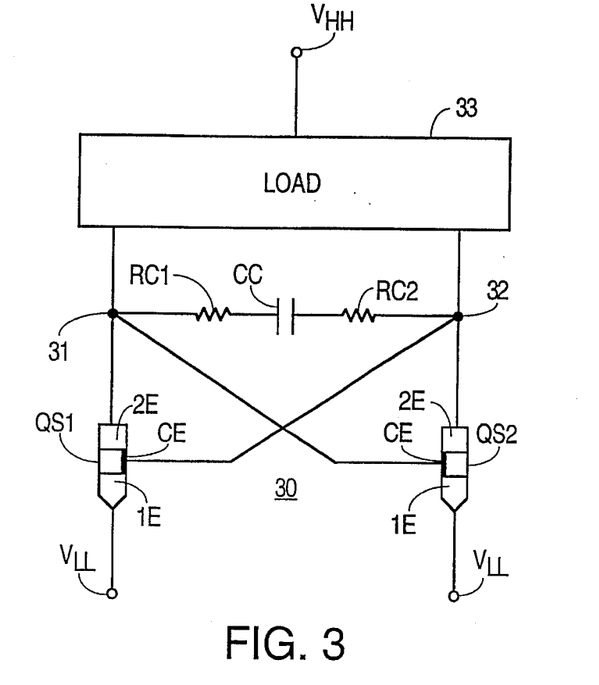
FIGS. 3 and 4 are circuit diagrams of complementary radiation-hardened static RAM cells in accordance with the invention.

Referring to FIG. 3, it illustrates a general static RAM cell 30 that employs a capacitive coupling technique for reducing sensitivity to alpha particles and other types of radiation according to the teachings of the invention. Static RAM cell 30 contains a pair of substantially identical like-polarity general storage transistors QS1 and QS2 whose first electrodes are connected to the $V_{LL}$ low voltage supply. The second electrodes of transistors QS1 and QS2 are cross connected through storage nodes 31 and 32 to their control electrodes for storing a bit of information. Transistors QS1 and QS2 can be implemented as enhancement-mode N-channel FETs or as NPN transistors.

A load 33 is connected between the $V_{HH}$ high voltage supply and storage nodes 31 and 32. If transistors QS1 and QS2 consist of N-channel FETs, load 33 can be implemented in any of the following ways: (a) a pair of equal-value resistors, (b) a pair of substantially identical enhancement-mode cross-connected P-channel FETs, (c) a pair of substantially identical depletion-mode N-channel FETs whose gate electrodes are connected to their sources in a diode manner, or (d) a pair of PN diodes, each in series with a corresponding resistor. For the NPN implementation of transistors QS1 and QS2, load 33 is formed with a pair of equal-value resistors.

Cell 30 is in one of two binary logic states. During normal operation, one of transistors QS1 and QS2 is on while the other is off. If transistor QS1 is on and transistor QS2 is off, the voltage at node 31 is low, and the voltage at node 32 is high. This defines one of the states. If transistor QS1 is off and transistor QS2 is on, the voltage at node 31 is high, and the voltage at node 32 is low. This defines the other state.

A coupling capacitor CC is coupled in series with non-parasitic coupling resistors RC1 and RC2 between storage nodes 31 and 32. Coupling resistors RC1 and RC2, which are situated on opposite sides of coupling capacitor CC, normally are of substantially the same value. Resistors RC1 and RC2 can both be of zero value, in which case capacitor CC is connected directly between nodes 31 and 32.

Coupling capacitor CC in combination with resistors RC1 and RC2 (when present) provides radiation hardness. In particular, capacitor CC increases the charge stored at node 31 or 32 for associated transistor QS1 or QS2 when it is turned off. If radiation such as alpha particles hits node 31 or 32 when associated transistor QS1 or QS2 is turned off, the increased charge at node 31 or 32 prevents the voltage at the control electrode of other transistor QS2 or QS1 from dropping below the threshold value needed to maintain that transistor in the on condition. This, in turn, prevents cell 30 from going into a transistor turn-on race condition in which originally off transistor QS1 or QS2 occasionally turns on (first) and causes cell 30 to switch state.

Cell 30 has a resistive-capacitive ("RC") time constant which determines the cell dynamics during an alpha particle hit. Taking note of the fact that capacitor CC has inherent (or parasitic) resistance, the cell RC time constant depends on the capacitive value of capacitor CC, its inherent resistance, and the RC1 and RC2 resistive values. Resistors RC1 and RC2 provide a mechanism for controlling the value of the cell RC time constant so as to prevent the additional charge supplied by capacitor CC from being removed during the period when an alpha particle hits cell 30.

Note that the problem attacked by the present invention does not arise if radiation such as alpha particles hits node 31 or 32 when associated transistor QS1 or QS2 is turned on. In that case, the radiation acts to reinforce the state of cell 30.

Figure 4:
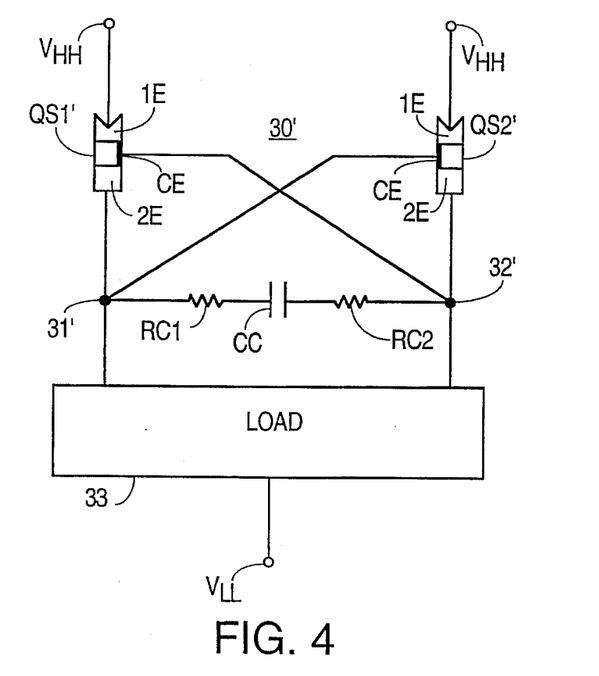

FIG. 4 depicts another general static RAM cell 30' that employs capacitive coupling to reduce sensitivity to alpha particles and other radiation according to the invention's teachings. Static RAM cell 30' contains substantially identical like-polarity general storage transistors QSi' and QS2' interconnected via storage nodes 31' and 32' to each other and to a load 33' in the same way as elements QS1, QS2, and 33 are arranged in FIG. 3 except that the voltage polarities are all reversed in FIG. 4. Static RAM cell 30' also contains coupling capacitor CC and coupling resistors RC1 and RC2 arranged the same as in FIG. 3.

Transistors QS1' and QS2' can be enhancement-mode P-channel FETs. Load 33' is then implemented in one of the following ways: (a) a pair of equal-value resistors, (b) a pair of substantially identical enhancement-mode cross-connected N-channel FETs, (c) a pair of substantially identical depletion-mode diode-connected P-channel FETs, or (d) a pair of PN diodes, each in series with a corresponding resistor. Transistors QSi' and QS2' can also be PNP transistors. In this case, load 33' is formed with a pair of equal-value resistors.

Static RAM cell 30' operates in the same way as cell 30 except that the voltage polarities are reversed. Thus, capacitor CC in combination with resistors RC1 and RC2 in cell 30' provides radiation hardness in the same manner as in cell 30. As such, cells 30 and 30' are both particularly suitable for space applications.

A "Miller" capacitor is a capacitive element connected between the drain and gate electrode of an FET or between the collector and base of a bipolar transistor. According to the Miller effect, the effective capacitance of a Miller capacitor equals the actual capacitance multiplied by the transistor gain.

When resistors RC1 and RC2 are absent or of sufficiently small value, coupling capacitor CC becomes a Miller capacitor for each of transistors QS1 and QS2. Transformation of capacitor CC into a Miller capacitor (by eliminating, or substantially eliminating, resistors RC1 and RC2) does slow down the cell switching speed somewhat. However, the Miller effect enables the amount of additional charge stored at mode 31 or 32 to be increased many times without increasing the size of capacitor CC and therefore without requiring an increase in the cell area beyond that already arising due to capacitor CC. This normally more than compensates for any decrease in cell switching speed.

Figure 5:
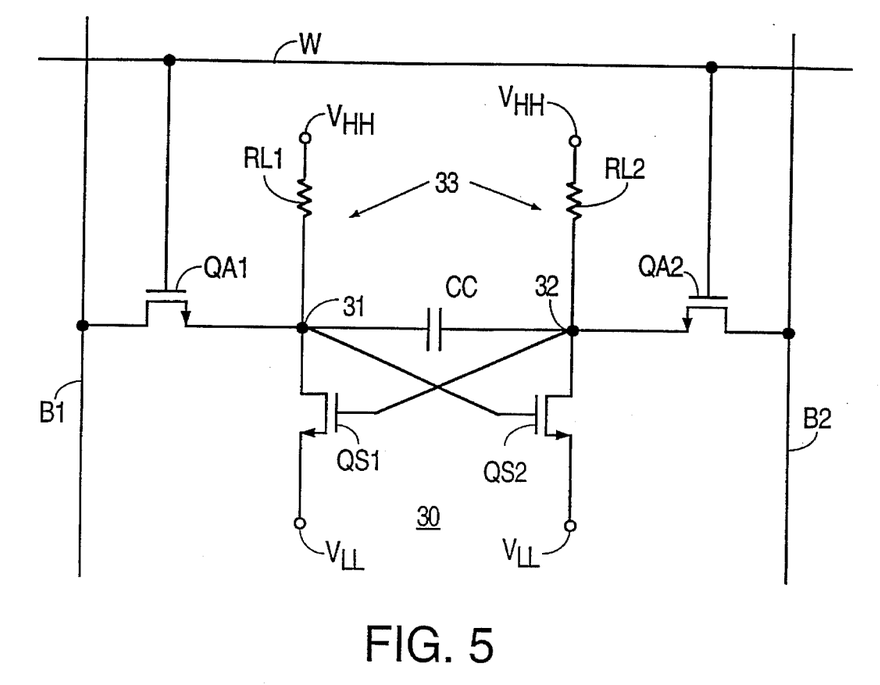
FIGS. 5 and 6 are circuit diagrams of MOS Miller-capacitor embodiments, including cell-access circuitry, the static RAM cell of FIG. 3.
Figure 6:
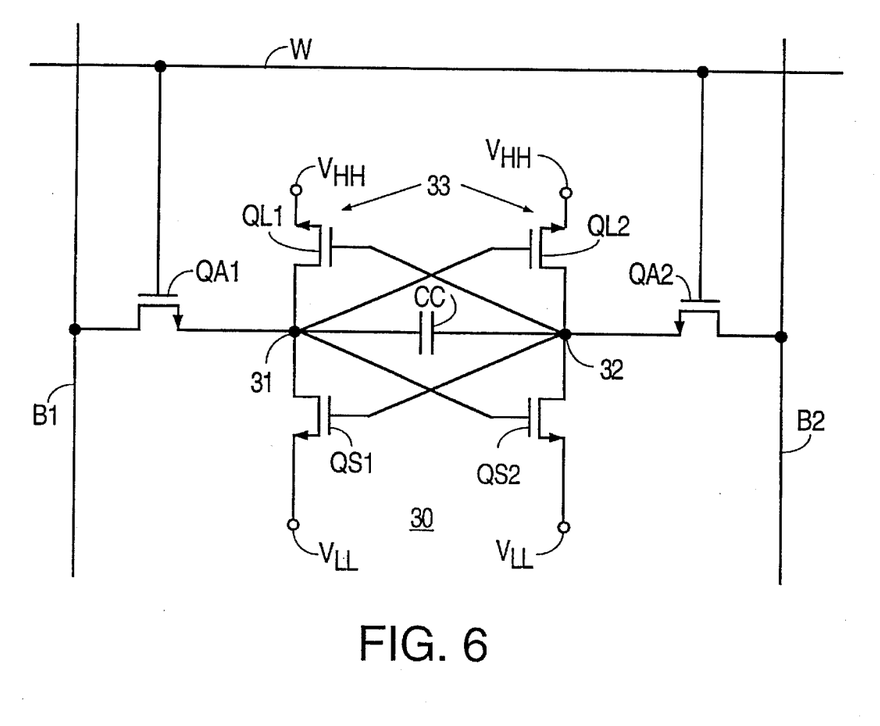

FIGS. 5 and 6 show MOS Miller-capacitor embodiments of static RAM cell 30 in FIG. 3 in which resistors RC1 and RC2 have zero resistance — i.e., they are absent. Storage transistors QS1 and QS2 are N-channel insulated-gate FETs in both of FIGS. 5 and 6. Capacitor CC, now a Miller capacitor, is 0.1–10 femtofarad, typically 1 femtofarad.

Static RAM cell 30 in both of FIGS. 5 and 6 also contains substantially identical enhancement-mode N-channel insulated-gate access FETs QA1 and QA2 whose gate electrodes are connected to word line W. The QA1 channel is connected between node 31 and bit line B1. The QA2 channel is connected between node 32 and bit line B2.

Load 33 in FIG. 5 consists of equal-value load resistors RL1 and RL2 connected between nodes 31 and 32, on one hand, and the $V_{HH}$ Supply, on the other hand. Resistors RL1 and RL2 provide a passive load for latching the state of cell 30. One of resistors RL1 and RL2 furnishes current of sufficiently high magnitude to the associated one of FETs QS1 and QS2 to maintain that storage FET in a fully conductive condition while the other load resistor provides substantially zero current to the other storage FET so that it can be nonconductive. The attendant voltage drops across resistors RL2 and RL1 cause the voltages at the gate electrodes of FETs QS1 and Qs2 to reach values sufficient to cause one of them to be conductive while the other is nonconductive.

Load 33 in FIG. 6 consists of substantially identical enhancement-mode P-channel load FETs QL1 and QL2 whose sources are connected to the $V_{HH}$ supply. The drains of FETs QL1 and QL2 are cross connected through nodes 31 and 32 to their gate electrodes. FET QL1 is on when FET QS1 is off, and vice versa. Likewise, FET QL2 is off when FET QS2 is on, and vice versa. Accordingly, one of FETs QL1 and QL2 is on when the other is off. The currents that flow through FETs QL1 and QL2 as a consequence of this one-on, one-off operation in combination with the resultant voltages across FETs QL1 and QL2 enable them to actively latch the state of cell 30.

During read and write operations, the voltage on word line W in FIGS. 5 or 6 is raised to a sufficiently high level to turn access FETs QA1 and QA2 both on. The state of cell 30 is read by sensing the voltage difference between nodes 31 and 32 using a suitable sense amplifier connected to bit lines B1 and B2. To write a bit of information into cell 30, the voltage on one of lines B1 and B2 is brought to a sufficiently high level to cause the associated one of FETs QS1 and QS2 to become conductive while the voltage on the other of lines B1 and B2 is maintained at a low level.

Consider the case in which capacitor CC in cell 30 of FIGS. 5 or 6 has the same capacitance as each of capacitors CS1 and CS2 in cell 10 of FIG. 1. Capacitor CC then provides approximately the same radiation hardening as both of capacitors CS1 and CS2. If capacitors CS1, CS2, and CC are all implemented as parallel-plate capacitors that do not overlie other parts of cells 10 and 30, cell 30 requires approximately 50% less additional capacitor space than cell 10 to attain the requisite radiation hardness level.

Figure 7:
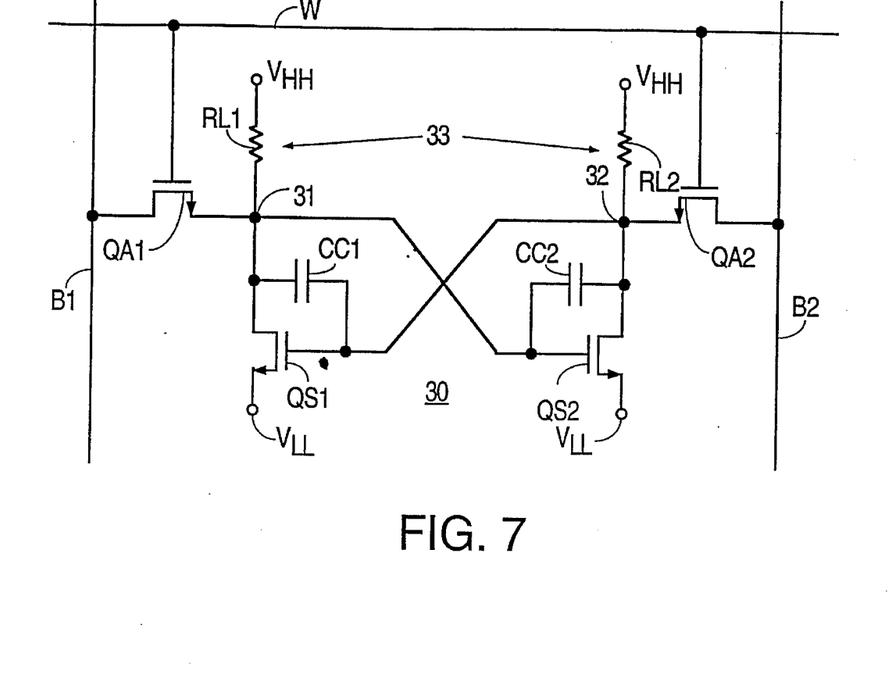
FIGS. 7 and 8 are circuit diagrams for specific implementations of the MOS static RAM cells of FIGS. 5 and 6, respectively.

FIG. 7 illustrates an embodiment of FIG. 5 in which capacitor CC is implemented with a pair of equal-value Miller capacitors CC1 and CC2. Capacitor CC1 is connected between the drain and gate electrode of N-channel FET QS1. Capacitor CC2 is similarly connected between the drain and gate electrode of N-channel FET QS2. The value of capacitor CC in FIG. 5 equals the sum of the values of capacitors CC1 and CC2 in FIG. 7.

Figure 8:
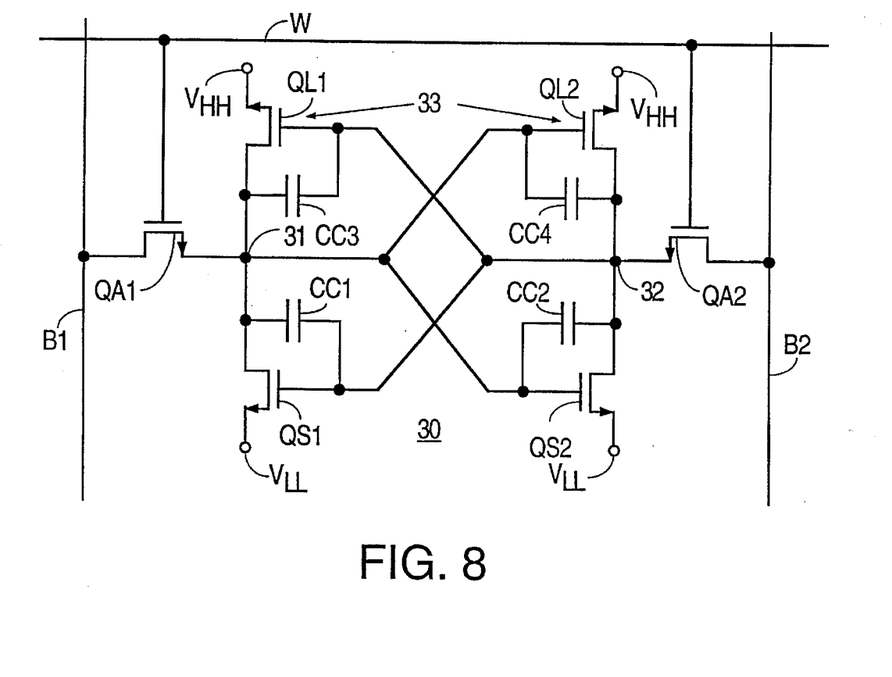

FIG. 8 depicts an embodiment of FIG. 6 in which capacitor CC is implemented with Miller capacitors CC1 and CC2 connected the same as in FIG. 7 and, optionally, also with equal-value Miller capacitors CC3 and CC4. When capacitors CC3 and CC4 are present, capacitor CC3 is connected between the QL1 drain and gate electrode, and capacitor CC4 is connected between the QL2 drain and gate electrode. The value of capacitor CC in FIG. 6 then equals the sum of the values of capacitors CC1 – CC4. When capacitors CC3 and CC4 are absent, the value of capacitor CC in FIG. 6 is equal to the sum of the values of capacitors CC1 and CC2 in FIG. 8.

Figure 9:
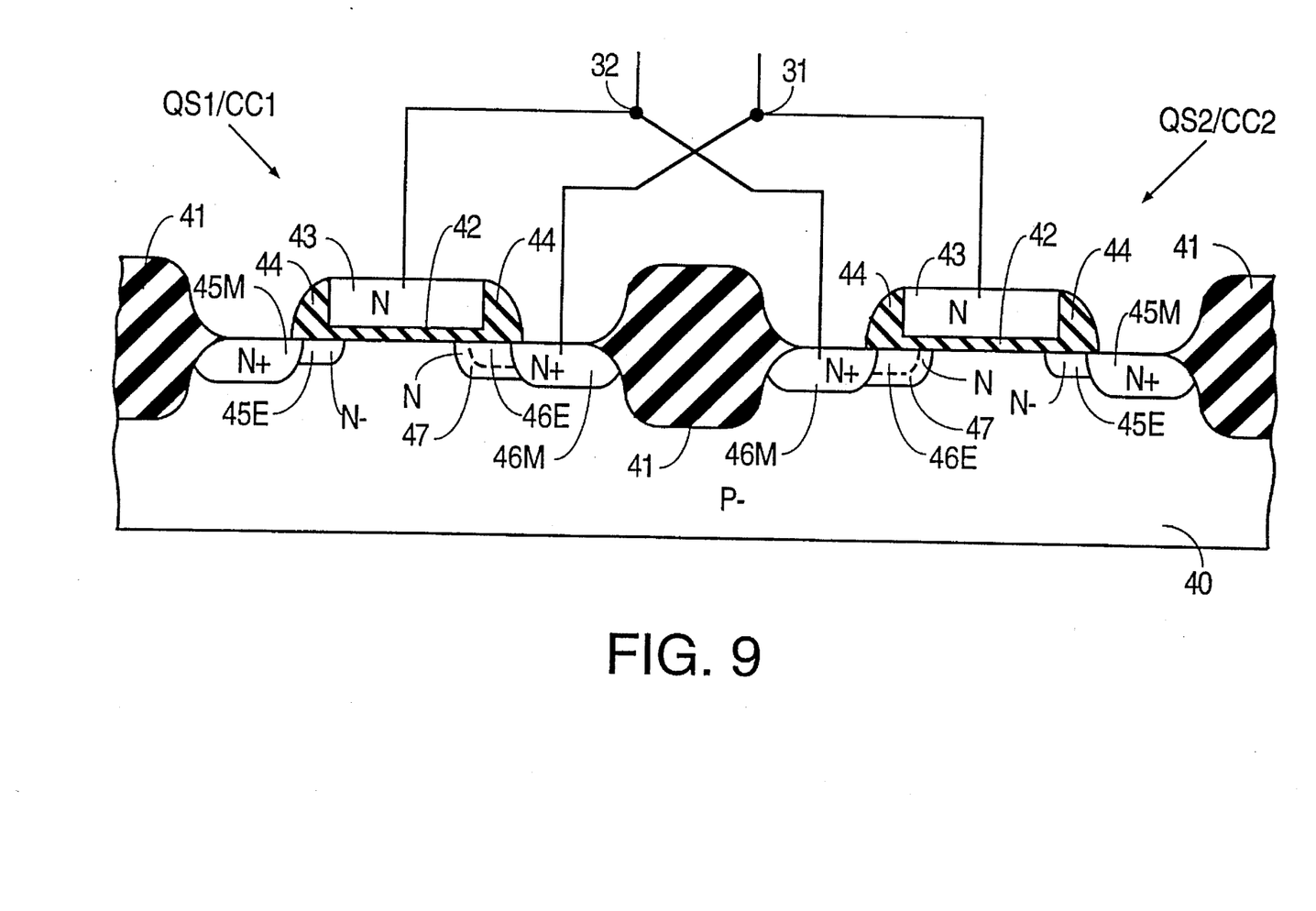
FIG. 9 is a cross-sectional view of a structure for the storage FETs and associated Miller capacitors in the implementation of FIG. 7 or 8.

Turning to FIG. 9, it shows a preferred lightly doped drain ("LDD") structure for elements QS1, CC1, QS2, and cc2 in the Miller implementation of FIGS. 7 or 8. This LDD structure is created from a lightly doped P-type monosilicon semiconductor body 40. An annular electrically insulating region 41 of silicon dioxide lies along the upper surface of P− substrate 40. Oxide region 41 laterally surrounds each of a group of active semiconductor islands so as to laterally separate each active island from each other active island. Two such islands are indicated in FIG. 9, one to the left for elements QS1 and CC1, and the other to the right for elements QS2 and CC2.

A gate dielectric layer 42 consisting of silicon dioxide is situated over part of each active island in FIG. 9. A patterned gate electrode 43 formed with conductively doped N-type polycrystalline silicon ("polysilicon") lies over each gate dielectric layer 42. Each gate electrode 43 has a source side and a drain side. A pair of electrically insulating sidewall spacers 44 consisting of silicon dioxide are located along the sides of each gate electrode 43 and are merged with dielectric layer 42.

A source consisting of a heavily doped main N-type source zone 45M and a lightly doped N-type source extension 45E is situated in each active island along the source side of gate electrode 43. N+ main source zone 45M extends below oxide spacer 44 on the source side but not laterally below gate electrode 43. N− source extension 45E extends below gate electrode 43 on the source side.

A drain consisting of a heavily doped main N-type drain zone 46M and a moderately doped N-type drain extension 47 is situated in each active island along the drain side of gate electrode 43. Main N+ zone 46M extends laterally below oxide spacer 44 on the drain side but not laterally below gate electrode 43. N drain extension 47 extends laterally below gate electrode 43 on the drain side.

As shown by the dashed lines in FIG. 9, each N drain extension 47 includes a portion 46E which extends laterally under gate electrode 43 to a distance substantially equal to the distance that associate source extension 45E extends laterally under gate electrode 43. The additional distance that drain extension 47 extends laterally below electrode 43 beyond that which source extension 45E extends below electrode 43 — i.e., substantially the distance between the edges of extensions 46E and 47 along the upper silicon surface — creates a non-parasitic capacitance between the drain and gate electrode 43. For the left-hand island, this capacitor constitutes Miller capacitor CC1 merged with FET QS1. For the right-hand island, this capacitor constitutes Miller capacitor CC2 merged with storage transistor QS2.

Figure 10A:
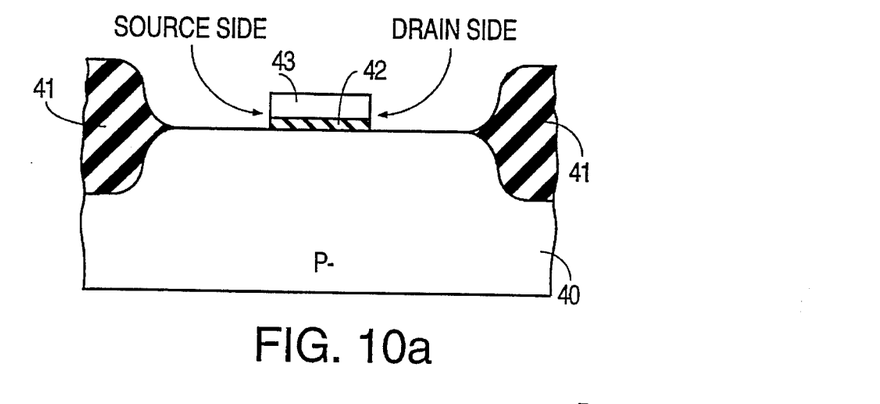
FIGS. 10a, 10b, 10c, 10d, 10e, and 10f are cross-sectional views representing steps in fabricating one storage FET and associated Miller capacitor in the structure of FIG. 9.

FIGS. 10a–10f illustrate how one of merged structures QS1/CC1 and QS2/CC2 is created from P-monosilicon substrate 40. With reference to FIG. 10a, a conventional LOCOS fabrication procedure is first employed to create oxide-isolation region 41 along the upper surface of substrate 40. Oxide-isolation region 41 has a thickness of 2,000–7,000 angstroms.

Gate dielectric 42 and gate electrode 43 are formed by thermally growing a thin layer of silicon dioxide along the upper surface of substrate 40 (after removing any prior material covering the active islands), depositing a layer of polysilicon on the thin oxide layer, and then patterning the two layers using a conventional selective etching technique. Electrode 43 can be conductively doped with an N-type impurity before or after the patterning stop. Gate dielectric 42 has a thickness of 70–200 angstroms. Gate electrode 43 has a thickness of 1,000–4,000 angstroms and a length (in the lateral direction in FIG. 10a) of 0.2 micron or more. The left-hand and right-hand sides of electrode 43 in FIG. 10a respectively are the source and drain sides.

Figure 10B:
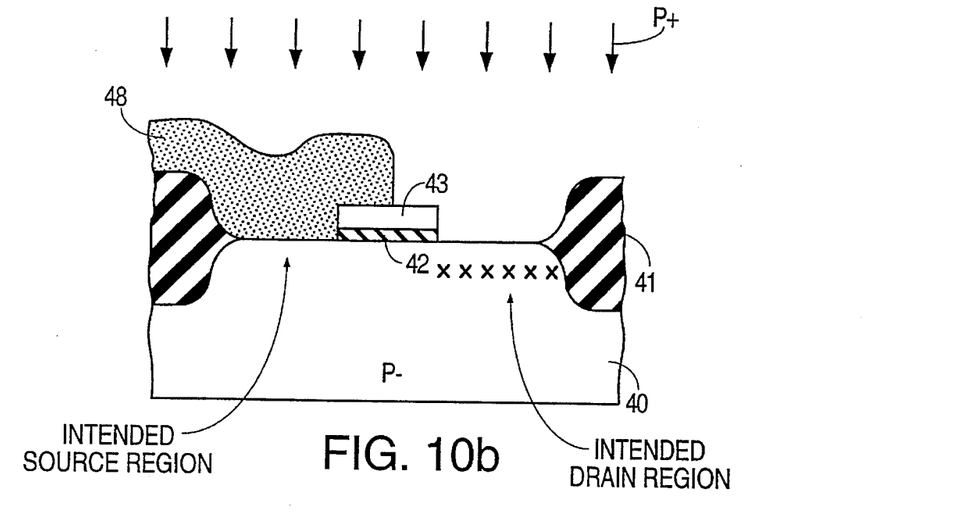
Figure 10C:
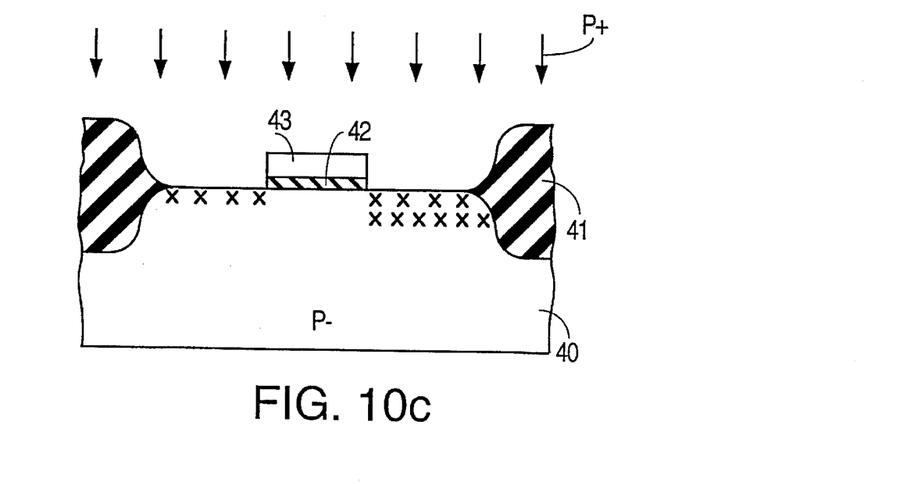

A pair of N-type ion implantations are performed using gate electrode 43 as a mask to prevent the implanted N-type impurities from entering the region intended for the FET channel. One of these implantations is utilized in defining source extension 45E in FIG. 9. The other implantation is employed in defining capacitor drain extension region 47 in FIG. 9. The order in which these two implantations are performed is immaterial. FIGS. 10b and 10c illustrate an exemplary case in which the capacitor implantation is performed before the source-extension implantation.

For the capacitor implantation, a patterned layer 48 of photoresist is created over the region intended for the source as shown in FIG. 10b. Photoresist layer 48 lies partly over oxide-isolation region 41 and gate electrode 43 but does not extend over the portion of the active island along the drain side of electrode 43.

An N-type impurity such as phosphorus in the form of P+ is ion implanted into the intended drain region using photoresist 48 to protect the intended source region. As mentioned above, gate electrode 43 protects the intended channel region. The capacitor implantation is performed at a dose of 5E13–5E14 ions/cm$^2$. The "Xes" in FIG. 10b indicate the location of the peak implant concentration. Photoresist 48 is subsequently removed. An anneal is optionally performed at this point to drive the implanted N-type impurity further into the silicon, activate the N-type species, and repair lattice damage. The anneal (when performed) is done at 850°–1000° C. for 10–60 min.

For the source-extension implantation, an N-type impurity such as phosphorus the form of P+ is ion implanted into the intended source and drain regions. See FIG. 10c. Gate electrode 43 again protects the intended channel region. The source-extension implantation is performed at a lower dose then the capacitor implementation. The shallow "Xes" in FIG. 10c indicate the location of the peak implant concentration during the source-extension implantation.

Figure 10D:
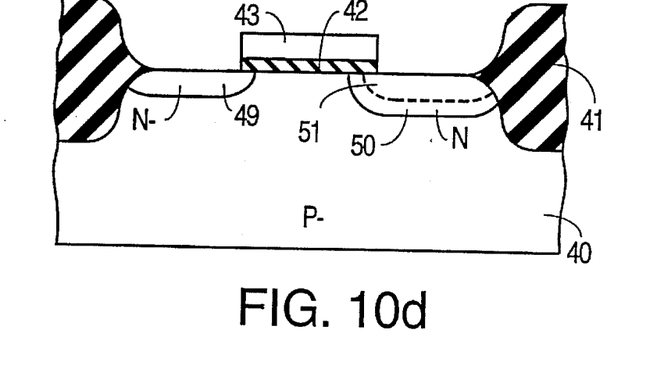

An anneal is typically performed to drive the implanted N-type species further into the silicon, activate the N-type species, and repair lattice damage. This anneal is likewise done at 850°–1000° C. for 10–60 min. FIG. 10d depicts the structure at the end of the anneal. Item 49 is a lightly doped N-type zone situated in part of the intended source region. Item 50 is a moderately doped N-type zone situated in part of the intended drain region.

N− zone 49 and N zone 50 both extend laterally below gate electrode 43. Because the capacitor implantation is performed at a greater dose than the source-extension implantation, N zone 50 extends further under gate electrode 43 than source extension 49. The dashed line represented by item 51 in FIG. 10b roughly indicates the silicon boundary of the N-type impurity implanted into the intended drain region during the source-extension implantation.

Figure 10E:
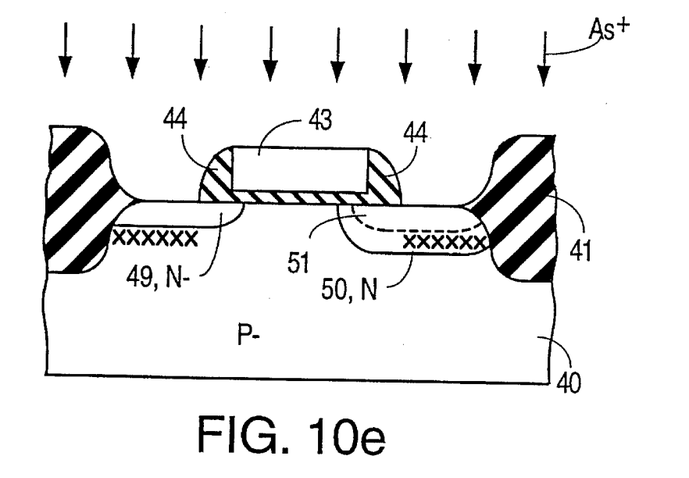

Sidewall spacers 44 are next formed along the sidewalls of gate electrode 43 as shown in FIG. 10e. A conventional technique, such as deposition of a blanket oxide layer followed by an anisotropic etch, is used to create spacers 44.

A main N-type implantation for use in defining main zones 45M and 46M in FIG. 9 is now performed. In particular, an N-type impurity such as arsenic in the form of As+ is ion implanted into the intended source and drain regions. See FIG. 10e. During this main implantation, spacers 44 act as a mask in conjunction with gate electrode 43 to substantially prevent the N-type impurity from entering the silicon directly under elements 43 and 44.

The main implantation is performed at a greater dose, and typically a greater energy, then both of the earlier N-type implantations. The "Xes" in FIG. 10e indicates the location of peak implant concentration during the main implantation.

An anneal is performed to drive the newly implanted N-type species further into the silicon, activate the N-type species, and repair lattice damage. During this anneal, the N-type species introduced into substrate 40 during the first two implantations also move slightly further into the silicon. The anneal is done at 850°–1000° C. for 10–60 min.

Figure 10F:
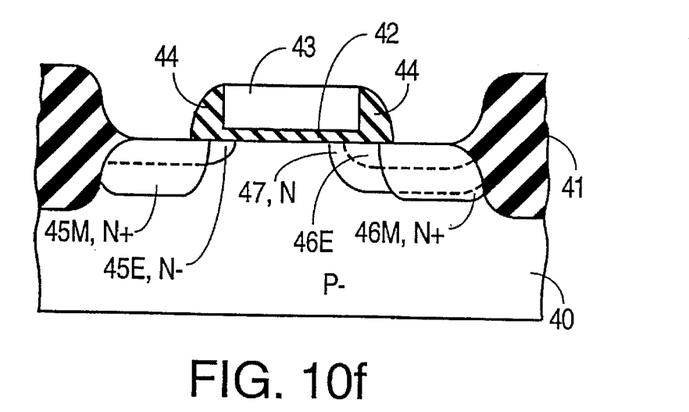

FIG. 10f illustrates the resultant LDD structure. The heavily doped N-type main source and drain zones which result from the driving and activation of the main implantation species respectively constitute main N+source and drain zones 45M and 46M. The portions of N– zone 49 and N zone 50 that extend outside main N+ zones 45M and 46M constitute N– source extension 45E and N drain extension 47. The portion of zone 51 that extends outside main drain zone 46M constitutes zone 46E. Due to the additional N-type dopant implanted into the drain region during the capacitor implantation, drain extension 47 extends further under gate electrode 43 than source extension 46E.

With the preceding in mind, static RAM cell 30 in FIGS. 7 and 8 is manufactured in the following way. The QS1/CC1 and QS2/CC2 structures are created in the manner described above. Access FETs QA1 and QA2 are created in the same way except that photoresist 48 extends fully over the intended QA1 and QA2 drains during the capacitor implantation. Consequently, the drain extensions for FETs QA1 and QA2 are of substantially the same size and doping as their source extensions.

The elements in load 33 are fabricated using appropriate semiconductor fabrication techniques. Resistors RL1 and RL2 in FIG. 7 can be defined in substrate 40 or formed as polysilicon resistors. If capacitors CC3 and CC4 are present, FETs QL1 and QL2 are respectively merged with capacitors CC3 and CC4 and then fabricated in a complementary manner to that used for structures QS1/CC1 and QS2/CC2. If capacitors cC3 and CC4 are absent, FETs QL1 and QL2 are fabricated in a complementary manner to that employed to create FETs QA1 and QA2.

Suitable interconnections are utilized to cross connect FETs QS1 and QS2 and to connect them to FETs QA1 and QA2. Suitable interconnections are also used to connect the elements in load 33 to FETs QS1 and QS2. The interconnections are typically created with one or more layers of conductivity doped polysilicon and/or a metal such as aluminum or an aluminum alloy. This completes the basic fabrication of cell 30 in FIGS. 7 and 8.

While the invention has been described with reference to particular embodiments, this description is solely for the purpose of illustration is not to be construed as limiting the scope of the invention claimed below. For example, coupling capacitor CC (including any or all of capacitors CC1–CC4) could be formed as a parallel-plate capacitor — e.g., a dielectric layer sandwiched between a pair of doped polysilicon plates or between a doped polysilicon plate and a doped monosilicon plate. When resistors RC1 and RC2 are present, they could be defined in substrate 40 or formed as polysilicon resistors.

One or both of the first two anneals in the fabrication procedure could be deleted. Various modifications and applications may thus be made by those skilled in the art without departing from the true scope and spirit of the invention as defined in the appended claims.

I claim:

1. A static memory cell comprising:

like-polarity first and second storage transistors, each having a first flow electrode, a second flow electrode, and a control electrode for controlling current flow between the flow electrodes, the second flow electrodes of the first and second storage transistors being cross coupled with their control electrodes for storing a bit of information;

a load coupled to the second flow electrodes;

a non-parasitic capacitor coupled between the second flow electrodes; and first and second resistors coupled between the second electrodes in series with the capacitor on opposite sides of the capacitor.

2. A static memory cell comprising:

like-polarity first and second storage transistors, each having a first flow electrode, a second flow electrode, and a control electrode for controlling current flow between the flow electrodes, the second flow electrodes of the first and second storage transistors being cross coupled with their control electrodes for storing a bit of information;

a load coupled to the second flow electrodes;

a non-parasitic capacitor coupled between the second flow electrodes; and first and second resistors, separate from the load, coupled between the second electrodes in series with the capacitor on opposite sides of the capacitor.

3. A cell as in claim 2 wherein charge carriers that move between the flow electrodes of each storage transistor originate at its first electrode and terminate at its second electrode.

4. A cell as in claim 2 wherein each storage transistor is a field-effect transistor ("FET") having a source, a drain, and a gate electrode which respectively are the first flow, second flow, and control electrodes for that transistor.

5. A cell as in claim 4 wherein each storage FET is an insulated-gate FET.

6. A cell as in claim 4 further including like-polarity first and second access FETs having respective gate electrodes coupled to a word line, the first access FET having a channel coupled between a first bit line and the drain of the first storage FET, the second access FET having a channel coupled between a second bit line and the drain of the second storage FET.

7. A cell as in claim 6 wherein the access FETs are of the same polarity as the storage FETs.

8. A cell as in claim 4 wherein the load comprises first and second load resistors respectively coupled to the drains of the first and second storage FETs.

9. A cell as in claim 4 wherein the load comprises first and second load resistors respectively coupled to the drains of the first and second storage FETs.

10. A static memory cell comprising:

like-polarity first and second storage transistors, each having a first flow electrode, a second flow electrode, and a control electrode for controlling current flow between the flow electrodes, wherein charge carriers that move between the flow electrodes of each storage transistor originate at its first electrode and terminate at its second electrode, the second flow electrodes of the first and second storage transistors being cross coupled with their control electrodes for storing a bit of information;

a load coupled to the second flow electrodes;

a first non-parasitic Miller capacitor connected directly between the second and control electrodes of the first transistor; and a second non-parasitic Miller capacitor connected directly between the second and control electrodes of the second transistor.

11. A cell as in claim 10 wherein each storage transistor is a field-effect transistor ("FET") having a source, a drain, and a gate electrode which respectively are the first flow, second flow, and control electrodes for that transistor.

12. A cell as in claim 11 wherein each storage FET is an insulated-gate FET.

13. A cell as in claim 10 wherein the load comprises first and second load resistors respectively coupled to the drains of the first and second storage FETs.

14. A cell as in claim 10 wherein the load comprises like-polarity first and second load FETs.

15. A cell as in claim 14 wherein the load FETs are of opposite polarity to the storage FETs, each load FET having a source, a drain, and a gate electrode, the load FETs being cross coupled via their drains and gate electrodes, the drains of the first and second load FETs being respectively coupled to the drains of the first and second storage FETs.

16. A static memory cell comprising:

like-polarity first and second storage transistors, each having a first flow electrode, a second flow electrode, and a control electrode for controlling current flow between the flow electrodes, the second flow electrodes of the first and second storage transistors being cross coupled with their control electrodes for storing a bit of information;

a load coupled to the second flow electrodes wherein the load comprises like-polarity first and second load transistors; and a non-parasitic Miller capacitor connected directly between the second flow electrodes.

17. A cell as in claim 16 wherein each storage transistor is a field-effect transistor ("FET") having a source, a drain, and a gate electrode which respectively are the first flow, second flow, and control electrodes for that transistor.

18. A cell as in claim 17 wherein each storage FET is an insulated-gate FET.

19. A cell as in claim 16 wherein the load transistors are of opposite polarity to the storage transistors, each load transistor having a first flow electrode, a second flow electrode, and a control electrode, the load transistors being cross coupled via their second flow and control electrodes, the second flow electrodes of the first and second load transistors being respectively coupled to the second flow electrodes of the first and second storage transistors.

20. A static memory cell comprising:

like-polarity first and second storage field-effect transistors (FETs), each having a source, a drain, and a gate electrode for controlling current flow between the source and the drains, the drains of the first and second storage FETs being cross coupled with their gate electrodes for storing a bit of information;

a load coupled to the drains wherein:

(a) the drains and sources of the storage FETs are situated in a semiconductor body along its upper surface, (b) the gate electrode of each storage FET is situated over the upper surface above a semiconductive channel region extending between the source and drain of that FET, (c) the source of each storage FET laterally extends partially under its gate electrode, and (d) the drain of each storage FET laterally extends partially under its gate electrode to a distance greater than its source such that a non-parasitic capacitance exists between that drain and gate electrode.

21. A cell as in claim 20 wherein the drain of each storage FET comprises (a) a main zone that does not laterally extend below that FETs gate electrode and (b) a more lightly doped extension that laterally extends below that FETs gate electrode.

22. A cell as in claim 20 further including like-polarity first and second access FETs having respective gate electrodes coupled to a word line, the first access FET having a channel coupled between a first bit line and the drain of the first storage FET, the second access FET having a channel coupled between a second bit line and the drain of the second storage FET.

23. A cell as in claim 22 wherein the access FETs are of the same polarity as the storage FETs.

24. A cell as in claim 20 wherein the load comprises like-polarity first and second load FETs.

25. A cell as in claim 20 wherein the load FETs are of opposite polarity to the storage FETs, each load FET having a source, a drain, and a gate electrode, the load FETs being cross coupled via their drains and gate electrodes, the drains of the first and second load FETs being respectively coupled to the drains of the first and second storage FETs.

26. A static memory cell comprising:

like-polarity first and second field-effect transistors ("FETs"), each having a source, a drain, and a gate electrode for controlling current flow between the source and drains, the drains of the first and second FETs being cross coupled with their gate electrodes for storing a bit of information;

a load including like-polarity first and second load FETs of opposite polarity to the storage FETs, each load FET having a source, a drain, and a gate electrode, the load FETs being cross coupled via their drains and gate electrodes, the drains of the first and second load FETs being respectively coupled to the drains of the first and second storage FETs;

a non-parasitic capacitor coupled between the drains wherein the capacitor includes:

a first capacitor coupled between the drain and gate electrode of the first storage FET;

a second capacitor coupled between the drain and gate electrode of the second storage FET;

a third capacitor coupled between the drain and gate electrode of the first load FET; and a fourth capacitor coupled between the drain and gate electrode of the second load FET.

27. A static memory cell comprising:

like-polarity first and second storage transistors, each having a first flow electrode, a second flow electrode, and a control electrode for controlling current flow between the flow electrodes, the second flow electrodes of the first and second storage transistors being cross coupled with their control electrodes for storing a bit of information;

a load including like-polarity first and second load transistors of opposite polarity to the storage transistors, each load transistor having a first flow electrode, a second flow electrode, and a control electrode, the load transistors being cross coupled via their second flow electrodes and control electrodes, the second flow electrodes of the first and second load transistors being respectively coupled to the second flow electrodes of the first and second storage transistors;

a non-parasitic capacitor coupled between the second flow electrodes wherein the capacitor includes:

a first capacitor coupled between the second flow electrode and control electrode of the first storage transistor;

a second capacitor coupled between the second flow electrode and control electrode of the second storage transistor;

a third capacitor coupled between the second flow electrode and control electrode of the first load transistor; and a fourth capacitor coupled between the second flow electrode and control electrode of the second load transistor.

28. A static memory cell comprising:

like-polarity first and second storage field-effect transistors ("FETs") each having a source, a drain, and a control electrode, the drains of the first and second storage FETs being cross coupled with their control electrodes for storing a bit of information;

a load comprising like-polarity first and second load FETs coupled to the drains of the first and second storage FETs;

a non-parasitic capacitor coupled between the drains of the first and second storage FETs; and first and second resistors coupled between the drains of the first and second storage FETs in series with the capacitor on opposite sides of the capacitor.

29. A cell as in claim 28 wherein the load FETs are of opposite polarity to the storage FETs, each load FET having a source, a drain, and a control electrode, the load FETs being cross coupled via their drains and control electrodes, the drains of the first and second load FETs being respectively coupled to the drains of the first and second storage FETs.

30. A cell as in claim 1 wherein charge carriers that move between the flow electrodes of each storage transistor originate at its first electrode and terminate at its second electrode.

31. A cell as in claim 1 wherein each storage transistor is a field-effect transistor ("FET") having a source, a drain, and a gate electrode which respectively are the first flow, second flow, and control electrodes for that transistor.

32. A cell as in claim 31 wherein each storage FET is an insulated-gate FET.

33. A cell as in claim 31 further including like-polarity first and second access FETs having respective gate electrodes coupled to a word line, the first access FET having a channel coupled between a first bit line and the drain of the first storage FET, the second access FET having a channel coupled between a second bit line and the drain of the second storage FET.

34. A cell as in claim 33 wherein the access FETs are of the same polarity as the storage FETs.

35. A cell as in claim 31 wherein the load comprises first and second load resistors respectively coupled to the drains of the first and second storage FETs.

* * * * *